United States Patent
Kamata et al.

(10) Patent No.: US 8,396,434 B2
(45) Date of Patent: Mar. 12, 2013

(54) SIGNAL PROCESSING DEVICE AND METHOD AND RECEPTION SYSTEM

(75) Inventors: Hiroyuki Kamata, Kanagawa (JP); Yuichi Hirayama, Tokyo (JP); Hideyuki Matsumoto, Tokyo (JP)

(73) Assignee: Sony Corporation, Tokyo (JP)

( * ) Notice: Subject to any disclaimer, the term of this patent is extended or adjusted under 35 U.S.C. 154(b) by 378 days.

(21) Appl. No.: 12/784,764

(22) Filed: May 21, 2010

(65) Prior Publication Data

US 2010/0304700 A1 Dec. 2, 2010

(30) Foreign Application Priority Data

May 29, 2009 (JP) ................................ P2009-131259

(51) Int. Cl.
*H04B 1/04* (2006.01)
(52) U.S. Cl. .................... 455/127.1; 455/126; 455/232.1
(58) Field of Classification Search .... 455/127.1–127.5, 455/232.1–253.2
See application file for complete search history.

(56) References Cited

U.S. PATENT DOCUMENTS

| 6,859,505 B2 * | 2/2005 | Agami et al. ............. 455/235.1 |
| 2003/0114126 A1 * | 6/2003 | Wang et al. ............... 455/234.2 |
| 2003/0232607 A1 * | 12/2003 | Le Bars et al. ............. 455/126 |

FOREIGN PATENT DOCUMENTS

JP 2009 5352 1/2009

* cited by examiner

*Primary Examiner* — Lana N Le
(74) *Attorney, Agent, or Firm* — Frommer Lawrence & Haug LLP; William S. Frommer

(57) ABSTRACT

Disclosed herein is a signal processing device including an adjustment section configured to adjust the power of each of subinterval signals by multiplying the subinterval signals by a gain adapted to bring the power to a given level, the subinterval signals being input signals each having a frequency component of one of a plurality of subintervals into which the frequency band over which the power spectrum is to be measured is divided, and a correction section configured to correct the power of each of the subinterval signals, whose power has been adjusted by the adjustment section, by multiplying the power spectrum by the reciprocal of the gain used for adjustment of the power by the adjustment section.

6 Claims, 11 Drawing Sheets

F I G . 3
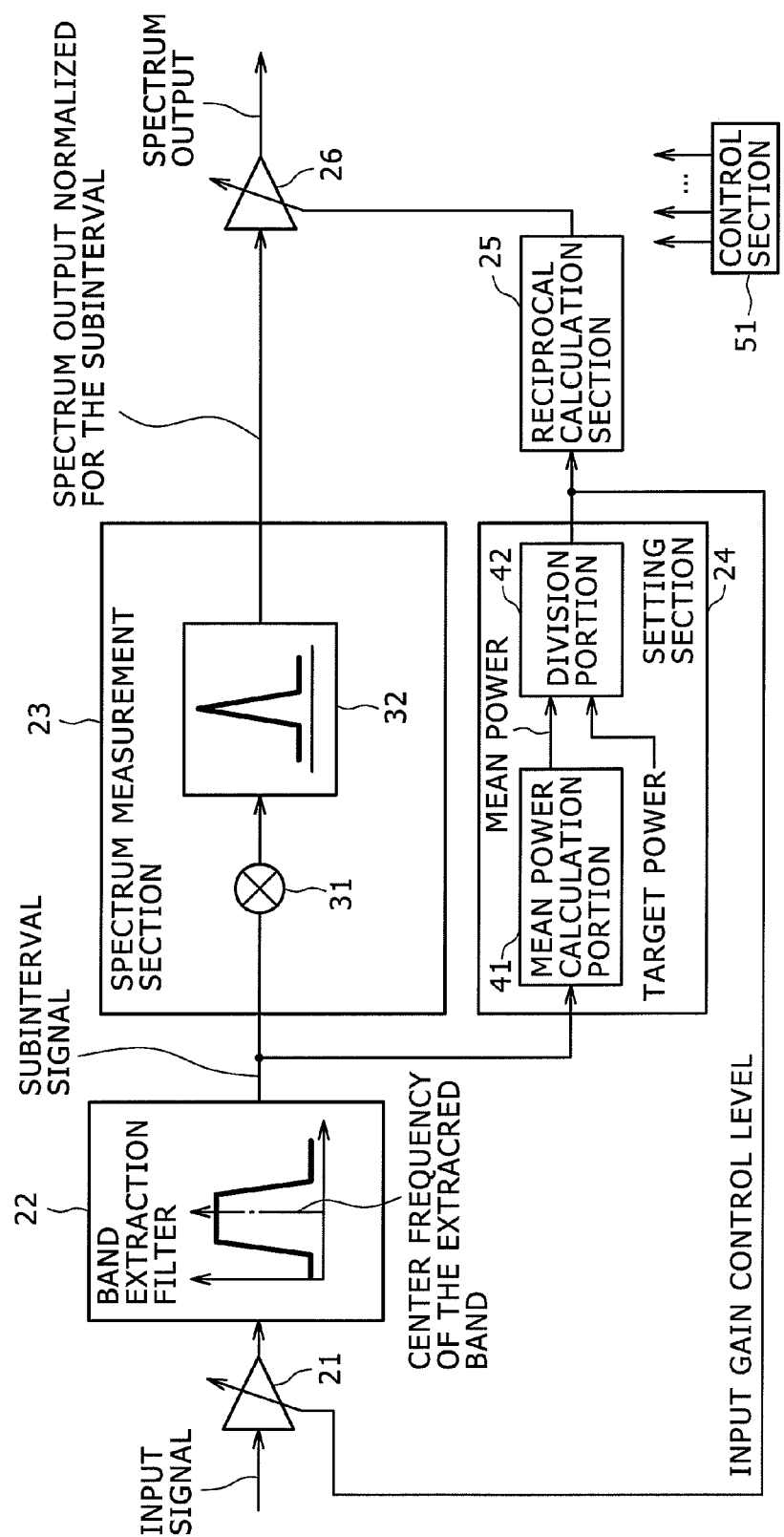

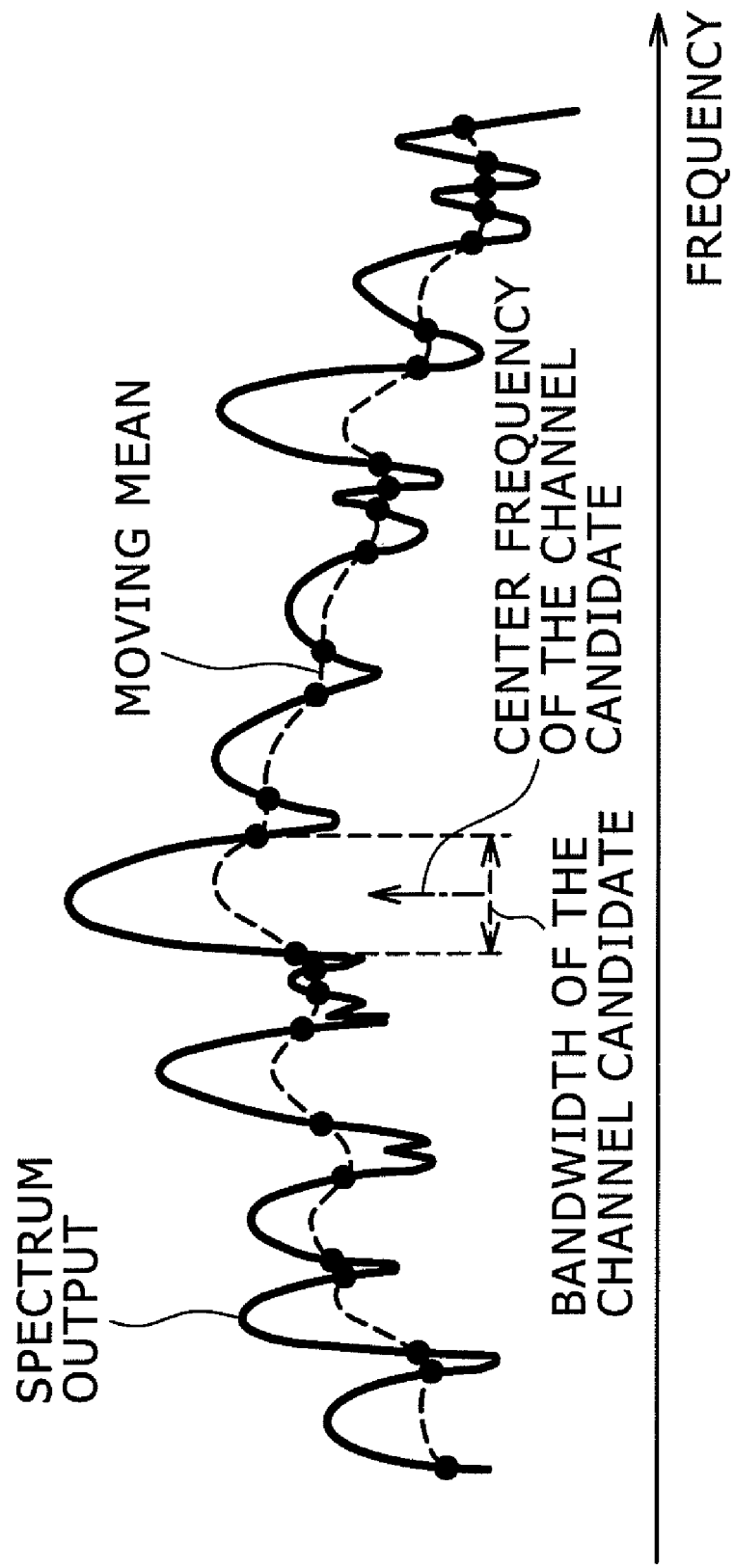

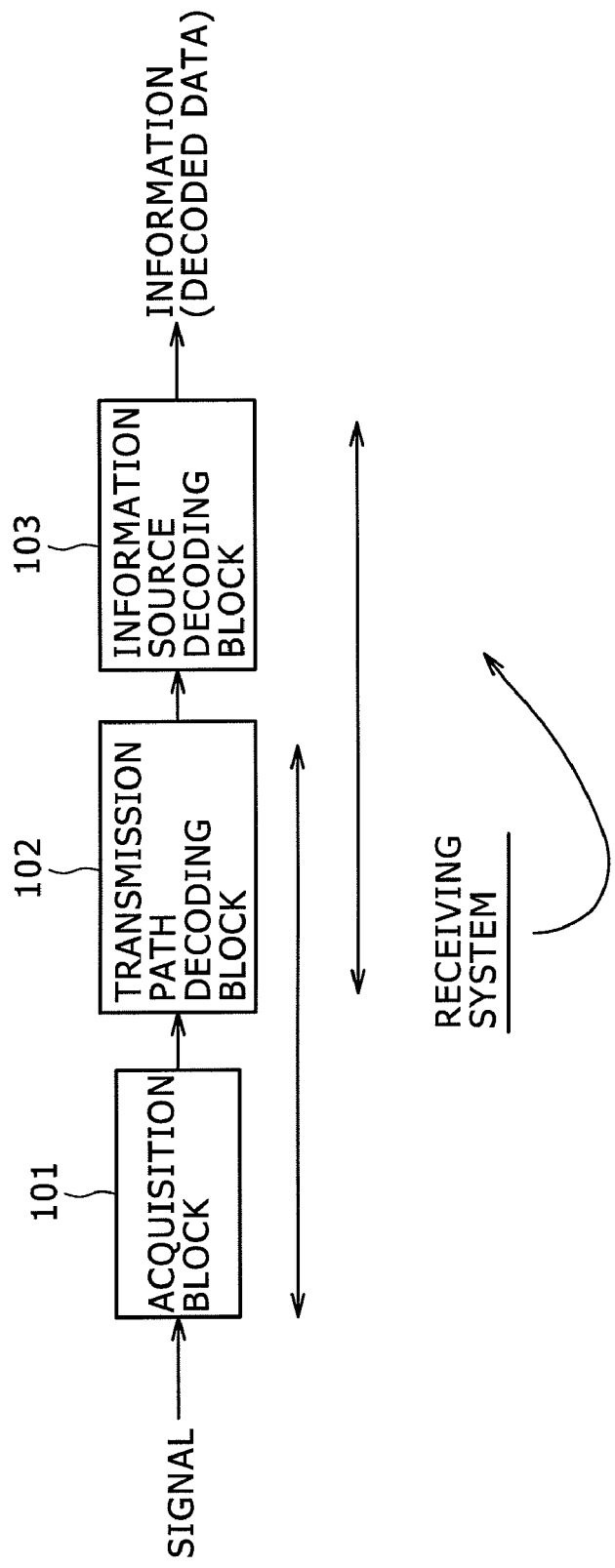

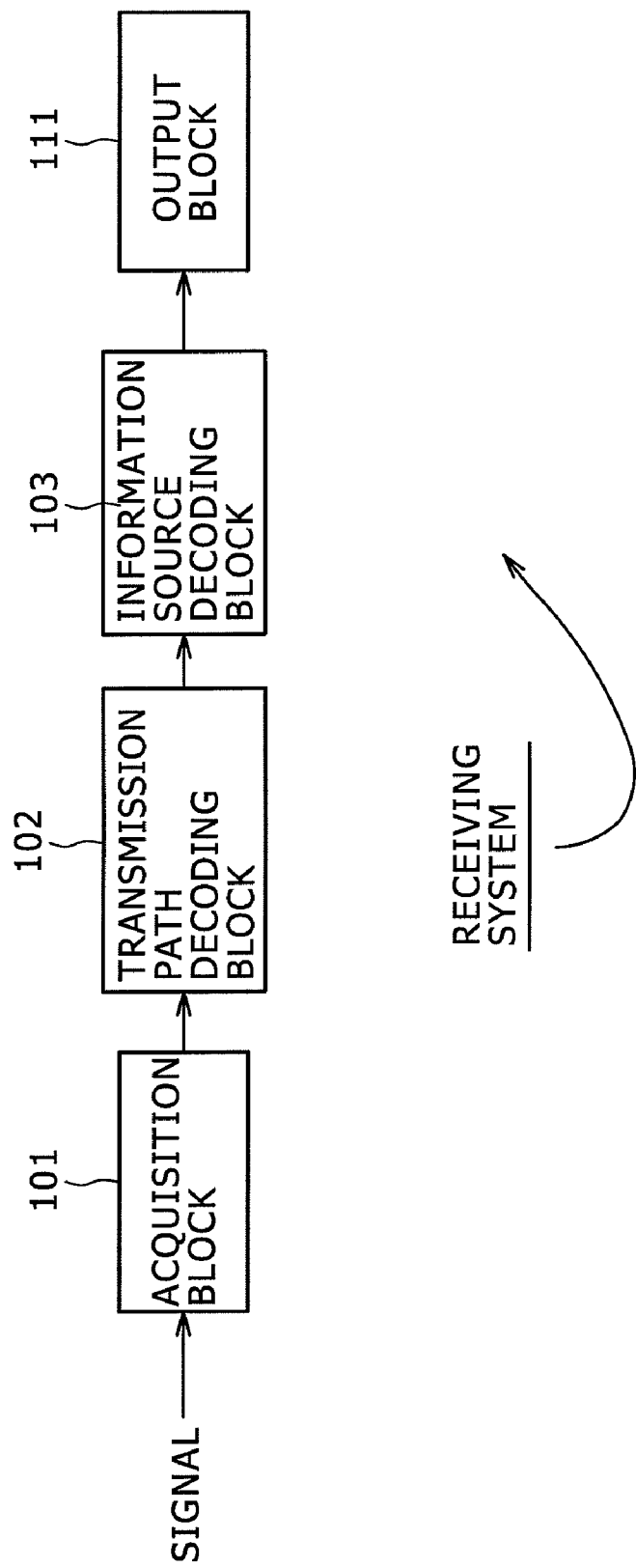

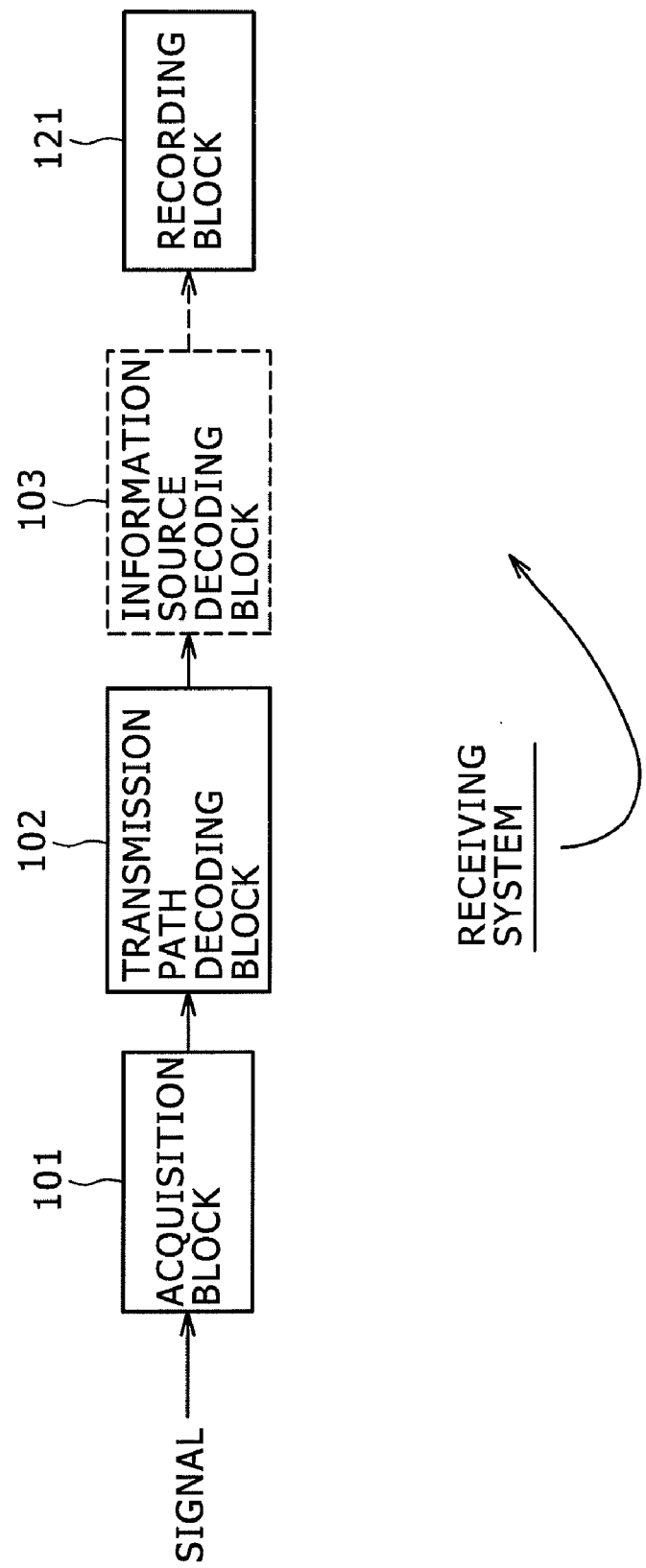

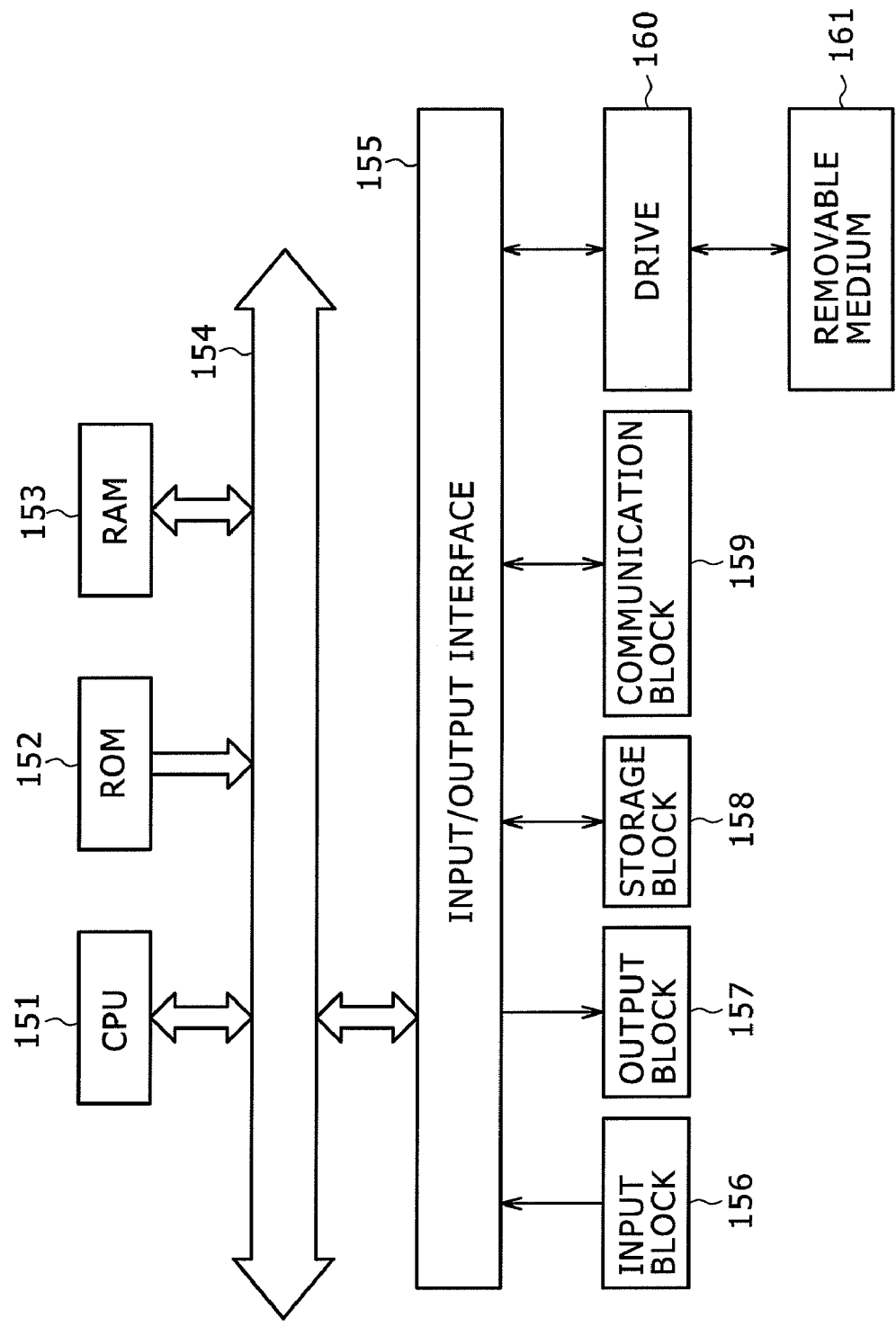

SIGNAL PROCESSING DEVICE AND METHOD AND RECEPTION SYSTEM

BACKGROUND OF THE INVENTION

1. Field of the Invention

The present invention relates to a signal processing device and method and reception system and, more particularly, to a signal processing device and method and reception system capable of measuring the power spectrum of a signal having a large variation in power level with high accuracy.

2. Description of the Related Art

Television receivers and television program recorders have a channel scan function adapted to automatically detect the frequency bands used for television broadcasting channels.

Channel scan is achieved by obtaining the power spectrum of the input signal and extracting, for example, the frequencies at which the peak power spectra appear, as the center frequencies of the channels used for television broadcasting.

FIG. 1 is a diagram illustrating the configuration of a spectrum acquisition block in the related art.

A spectrum acquisition block configured as shown in FIG. 1 is incorporated in a television receiver or program recorder. During channel scan, the spectrum acquisition block measures the power spectrum of the input signal, followed by the extraction of the channels by the processing section at the subsequent stage based on the measured power spectrum.

As illustrated in FIG. 1, the spectrum acquisition block includes an amplification section 1 and spectrum measurement section 2. A frequency conversion block 11 and narrow band filter 12 are provided in the spectrum measurement section 2. The input signal obtained as a result of the reception of radio wave by the antenna is fed to the amplification section 1.

The amplification section 1 adjusts the power of the input signal to a level that can be handled by the spectrum measurement section 2 with its gain set to a fixed level. The same section 1 outputs the adjusted input signal to the spectrum measurement section 2.

In the spectrum measurement section 2, the frequency conversion block 11 converts the frequency of the input signal supplied from the amplification section 1. The signal converted in frequency passes through the narrow band filter 12 so that the power spectrum thereof is measured. The power spectrum shows the power levels of different frequency components.

In the spectrum measurement section 2, the frequency conversion block 11 successively measures the power spectra of the target frequencies while at the same time sweeping the frequencies (changing the target frequencies). The signal representing the power spectra measured by the spectrum measurement section 2 is supplied to the processing section at the subsequent stage.

[Patent Document 1]
Japanese Patent Laid-Open No. 2009-5352

SUMMARY OF THE INVENTION

FIG. 2 is a diagram illustrating an example of input signal fed to the spectrum measurement section 2.

In FIG. 2, the horizontal axis represents the frequency, and the vertical axis the power. In reality, the power levels at different frequencies are shown along the frequency axis as illustrated in FIG. 2 as a result of the power spectrum measurement by the spectrum measurement section 2. Here, however, the input signal fed to the spectrum measurement section 2 is shown along the frequency axis.

The vertical length of the rectangle shown by dashed lines in FIG. 2 represents the range of power that can be measured by the spectrum measurement section 2 as a power spectrum. The horizontal length of the rectangle shown by dashed lines represents the frequency band over which the power spectrum is to be measured.

Basically, the power of the input signal is adjusted to fit into the dynamic range of the spectrum measurement section 2. However, the power is extremely large at some frequencies, and extremely small at some other frequencies. Such power levels do not fit into the dynamic range of the spectrum measurement section 2.

Components having a power level in excess of the upper limit of the dynamic range of the spectrum measurement section 2 saturate, and components having a power level below the lower limit thereof are invisible due to insufficient accuracy. In this case, the power spectrum may not be properly measured, thus resulting in degraded accuracy in channel extraction.

In light of the foregoing, it is a desire of the present invention to measure the power spectrum of a signal having a large variation in power level with high accuracy.

A signal processing device according to a first embodiment of the present invention includes adjustment means and correction means. The adjustment means adjusts the power of each of subinterval signals by multiplying the subinterval signals by a gain adapted to bring the power to a given level. The subinterval signals are input signals each having a frequency component of one of a plurality of subintervals into which the frequency band over which the power spectrum is to be measured is divided. The correction means corrects the power of each of the subinterval signals, whose power has been adjusted by the adjustment means, by multiplying the power spectrum by the reciprocal of the gain used for adjustment of the power by the adjustment means.

Measurement means can further be provided to measure the power spectrum of each of the subinterval signals whose power has been adjusted by the adjustment means.

Setting means can also be provided to set the value, obtained by dividing a target power by the mean power of the subinterval signals, in the adjustment means as the gain.

The target power can be set equal to the mean of the upper and lower limits of the power that can be measured by the measurement means as a power spectrum.

A signal processing method according to the first embodiment of the present invention includes a step of adjusting the power of each of subinterval signals by multiplying the subinterval signals by a gain adapted to bring the power to a given level. The subinterval signals are input signals each having a frequency component of one of a plurality of subintervals into which the frequency band over which the power spectrum is to be measured is divided. The signal processing method also includes a step of correcting the power of each of the subinterval signals, whose power has been adjusted, by multiplying the power spectrum by the reciprocal of the gain used for adjustment of the power.

A reception system according to a second embodiment of the present invention includes acquisition means and transmission path decoding means. The acquisition means acquires a signal transmitted over a transmission path. The transmission path decoding means performs processes on the signal acquired by the acquisition means including measurement of the power spectrum thereof. The transmission path decoding means includes adjustment means and correction means. The adjustment means adjusts the power of each of subinterval signals by multiplying the subinterval signals by a gain adapted to bring the power to a given level. The subinterval signals are input signals each having a frequency component of one of a plurality of subintervals into which the frequency band over which the power spectrum is to be measured is divided. The correction means corrects the power of each of the subinterval signals, whose power has been adjusted by the adjustment means, by multiplying the power spectrum by the reciprocal of the gain used for adjustment of the power by the adjustment means.

A reception system according to a third embodiment of the present invention includes transmission path decoding means and information source decoding means. The transmission path decoding means performs processes on the signal acquired via a transmission path including measurement of the power spectrum thereof. The source decoding means decodes data to be transmitted in the signal processed by the transmission path decoding means. The transmission path decoding means includes adjustment means and correction means. The adjustment means adjusts the power of each of subinterval signals by multiplying the subinterval signals by a gain adapted to bring the power to a given level. The subinterval signals are input signals each having a frequency component of one of a plurality of subintervals into which the frequency band over which the power spectrum is to be measured is divided. The correction means corrects the power of each of the subinterval signals, whose power has been adjusted by the adjustment means, by multiplying the power spectrum by the reciprocal of the gain used for adjustment of the power by the adjustment means.

A reception system according to a fourth embodiment of the present invention includes transmission path decoding means and output means. The transmission path decoding means performs processes on the signal acquired via a transmission path including measurement of the power spectrum thereof. The output means outputs an image or sound based on the signal processed by the transmission path decoding means. The transmission path decoding means includes adjustment means and correction means. The adjustment means adjusts the power of each of subinterval signals by multiplying the subinterval signals by a gain adapted to bring the power to a given level. The subinterval signals are input signals each having a frequency component of one of a plurality of subintervals into which the frequency band over which the power spectrum is to be measured is divided. The correction means corrects the power of each of the subinterval signals, whose power has been adjusted by the adjustment means, by multiplying the power spectrum by the reciprocal of the gain used for adjustment of the power by the adjustment means.

A reception system according to a fifth embodiment of the present invention includes transmission path decoding means and recording means. The transmission path decoding means performs processes on the signal acquired via a transmission path including measurement of the power spectrum thereof. The recording means records the signal processed by the transmission path decoding means. The transmission path decoding means includes adjustment means and correction means. The adjustment means adjusts the power of each of subinterval signals by multiplying the subinterval signals by a gain adapted to bring the power to a given level. The subinterval signals are input signals each having a frequency component of one of a plurality of subintervals into which the frequency band over which the power spectrum is to be measured is divided. The correction means corrects the power of each of the subinterval signals, whose power has been adjusted by the adjustment means, by multiplying the power spectrum by the reciprocal of the gain used for adjustment of the power by the adjustment means.

The present invention adjusts the power of each of subinterval signals by multiplying the subinterval signals by a gain adapted to bring the power to a given level. The subinterval signals are input signals each having a frequency component of one of a plurality of subintervals into which the frequency band over which the power spectrum is to be measured is divided. The present invention also corrects the power of each of the subinterval signals, whose power has been adjusted, by multiplying the power spectrum by the reciprocal of the gain used for adjustment of the power.

The present invention allows for measurement of the power spectrum of a signal having a large variation in power level with high accuracy.

BRIEF DESCRIPTION OF THE DRAWINGS

FIG. 3 is a diagram illustrating a configuration example of the spectrum acquisition block provided in a reception device according to an embodiment of the present invention;

FIG. 7 is a diagram illustrating an example of channel extraction;

FIG. 8 is a block diagram illustrating a first configuration example of a reception system;

FIG. 9 is a block diagram illustrating a second configuration example of the reception system;

FIG. 10 is a block diagram illustrating a third configuration example of the reception system; and FIG. 11 is a block diagram illustrating a configuration example of a computer.

DETAILED DESCRIPTION OF THE PREFERRED EMBODIMENTS

Figure 1:
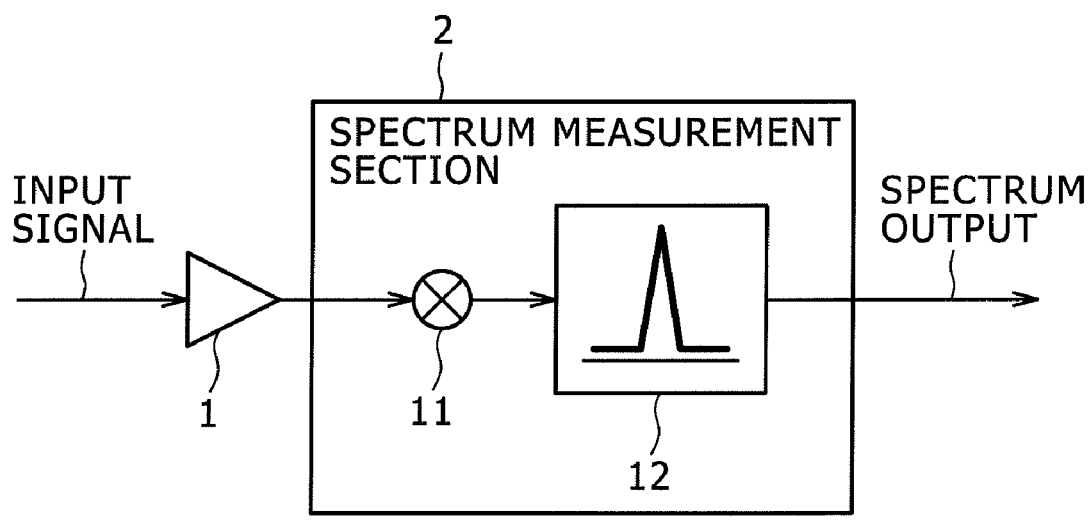
FIG. 1 is a diagram illustrating the configuration of a spectrum acquisition block in the related art.
Figure 2:
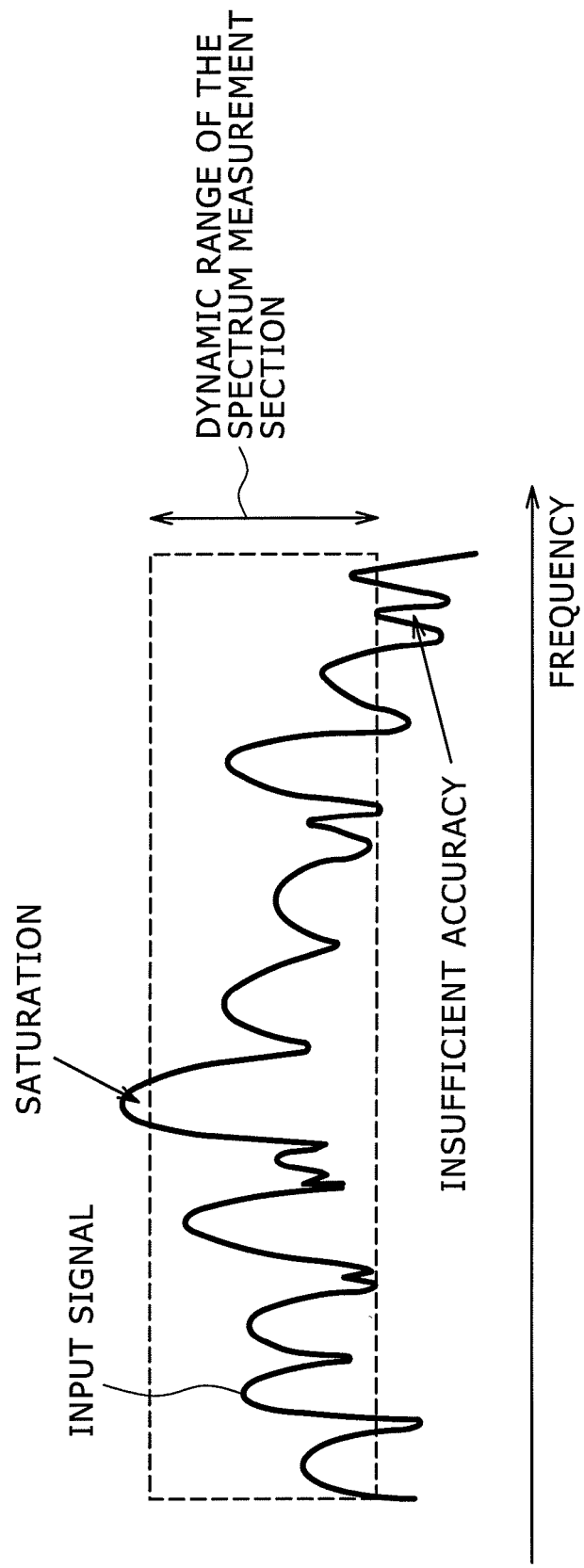
FIG. 2 is a diagram illustrating an example of a signal fed to a spectrum measurement section shown in FIG. 1.

[Configuration Example of the Spectrum Acquisition Block]

FIG. 3 is a diagram illustrating a configuration example of a spectrum acquisition block provided in a reception device according to an embodiment of the present invention.

As illustrated in FIG. 3, the spectrum acquisition block includes a variable input gain amplification section 21, band extraction filter 22, spectrum measurement section 23, setting section 24, reciprocal calculation section 25 and correction section 26. The spectrum measurement section 23 includes a frequency conversion portion 31 and narrow band filter 32. The setting section 24 includes a mean power calculation portion 41 and a division portion 42.

The operation of each of the components of the spectrum acquisition block is controlled by a control section 51 as its CPU (Central Processing Unit) or other device executes a given application program. The input signal obtained as a result of the reception of a radio wave by the antenna is fed to the variable input gain amplification section 21.

The variable input gain amplification section 21 corrects the gain based on the gain control level set by the setting section 24, thus adjusting the power of the input signal using the corrected gain.

As will be described later, the setting section 24 finds the input gain control level adapted to correct the gain. The gain is used to adjust the power of each of signals having a frequency component of each of intervals (subintervals). The subintervals are obtained by dividing the entire frequency band, over which the power spectrum is to be measured, into given frequency bands.

The variable input gain amplification section 21 multiplies the power level by the gain that has been corrected based on the value found as the input gain control level, thus adjusting the power of the signals each having a frequency component of one of subintervals. The same section 21 outputs the input signal, whose power has been adjusted, to the band extraction filter 22. It should be noted that before the input gain control level is set, the variable input gain amplification section 21 adjusts the power of the input signal with a given gain set in advance.

The band extraction filter 22 extracts a signal having a frequency component of one of the subintervals from the input signal supplied from the variable input gain amplification section 21. For example, the control section 51 successively sets center frequencies of the subintervals in the band extraction filter 22 in order of increasing frequency.

The band extraction filter 22 outputs a subinterval signal, i.e., a signal having a frequency component of one of the subintervals extracted relative to the set center frequency. The subinterval signal output from the band extraction filter 22 is supplied to the spectrum measurement section 23 and setting section 24.

The spectrum measurement section 23 measures the power spectrum of the subinterval signal supplied from the band extraction filter 22 following the correction of the gain by the variable input gain amplification section 21. The same section 23 converts the frequency of the subinterval signal with the frequency conversion portion 31 first. Next, the same section 23 passes the resultant signal through the narrow band filter 32, i.e., a power detection filter, thus measuring the power spectrum at different frequencies.

The power spectrum measured by the spectrum measurement section 23 is normalized relative to the target power for each of the subintervals divided by the band extraction filter 22. The power spectrum measured by the spectrum measurement section 23 is supplied to the correction section 26.

When a subinterval signal is supplied from the band extraction filter 22, the setting section 24 finds the input gain control level for the subinterval for which the subinterval signal has a frequency component and outputs the input gain control level to the variable input gain amplification section 21 and reciprocal calculation section 25.

For example, the mean power calculation portion 41 of the setting section 24 calculates the mean power of the supplied subinterval signal and outputs the calculated mean power to the division portion 42.

The division portion 42 outputs the input gain control level to the variable input gain amplification section 21 and reciprocal calculation section 25. The input gain control level is obtained by dividing the target power level, i.e., the power level to be achieved, by the mean power of the subinterval signal calculated by the mean power calculation portion 41. The control section 51 sets the target power level in the division portion 42. The target power level is, for example, the mean value of the upper and lower limits of the power that can be measured by the spectrum measurement section 23 as a power spectrum.

For example, if the target power level (voltage level) is set to 0.5 V, and if the mean power level of the subinterval signal calculated by the mean power calculation portion 41 is 0.1 V, then the ratio between the two levels or '5' is found by the division portion 42 as an input gain control level. This means that if the gain for the target subinterval is increased five times as much as the gain used by the variable input gain amplification section 21 at present, then the mean power of the subinterval signal can be set equal to its target power. The variable input gain amplification section 21 adjusts the power using the gain corrected to be five times as large as the original gain.

The reciprocal calculation section 25 calculates the reciprocal of the value supplied from the division portion 42 as the input gain control level and outputs the reciprocal to the correction section 26.

The correction section 26 corrects the measurement results of the spectrum measurement section 23 by multiplying the power level of the signal supplied from the same section 23 by the value calculated by the reciprocal calculation section 25. The power spectrum measured by the spectrum measurement section 23 is found for the signal whose power has been adjusted with the value obtained by dividing the target power by the mean power. As a result, the power spectrum of the original signal is found by multiplying the signal power level by the value obtained by dividing the mean power by the target power.

The power spectrum corrected by the correction section 26 is supplied to the processing section at the subsequent stage for channel extraction.

As described above, the spectrum acquisition block shown in FIG. 3 divides the entire frequency band, over which the power spectrum is to be measured, into a plurality of subintervals. Further, the spectrum acquisition block adjusts the power of the signal fed to the spectrum measurement section 23 so that the power of the signal having a frequency component for one of the subintervals is adjusted to fit into the dynamic range of the spectrum measurement section 23.

Figure 4:
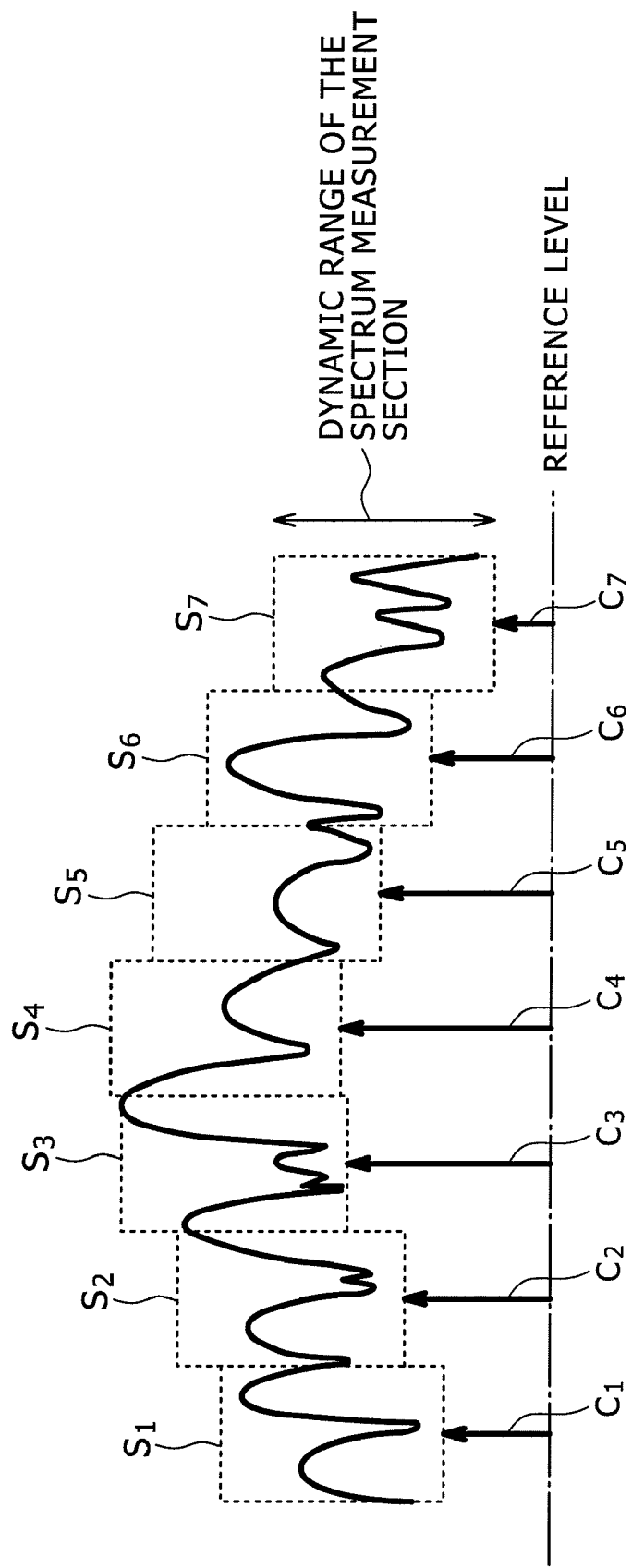
FIG. 4 is a diagram illustrating the concept of signal processing performed by the spectrum acquisition block shown in FIG. 3.

FIG. 4 is a diagram illustrating the concept of signal processing performed by the spectrum acquisition block.

In FIG. 4, the horizontal axis represents the frequency, and the vertical axis the power. The horizontal length of each of the rectangles shown by dashed lines represents the frequency band of each subinterval. The vertical length of each of the rectangles shown by dashed lines represents the dynamic range of power that can be measured by the spectrum measurement section 23 as a power spectrum.

As illustrated in FIG. 4, the input signal to be extracted by the band extraction filter 22 at the subsequent stage as a subinterval $S_1$ signal is adjusted in power by the variable input gain amplification section 21 using a gain that has been corrected with an input gain control level $C_1$. The same level $C_1$ is expressed as the ratio between the mean and target power levels of the subinterval $S_1$.

On the other hand, the input signal to be extracted as a subinterval $S_2$ signal is adjusted in power by the variable input gain amplification section 21 using a gain that has been corrected with an input gain control level $C_2$. The same level $C_2$ is expressed as the ratio between the mean and target power levels of the subinterval $S_2$ signal. For other subintervals, the input signals are similarly adjusted in power using gains that have been corrected with input gain control levels. Each of these levels is expressed as the ratio between the mean and target power levels of the subinterval of interest.

The adjustment of the power of each of the subinterval signals ensures that the power of each of the subinterval signals fits properly into the dynamic range of the spectrum measurement section 23. This provides a substantially wider power range that can be measured as a power spectrum. In the case of the example shown in FIG. 4, the upper limit of the power that can be measured as a power spectrum is the power level at the upper side of the rectangle shown by dashed lines representing a subinterval $S_4$, and the lower limit thereof the power level at the lower side of the rectangle shown by dashed lines representing a subinterval $S_7$.

Further, because the subinterval signals, adjusted in power to fit into the dynamic range, are measured, the power spectrum can be measured with high accuracy.

It should be noted that although FIG. 4 shows that the dynamic range of the spectrum measurement section 23 is adjusted, the input signal power is, in reality, adjusted relative to the dynamic range of the spectrum measurement section 23.

[Operation of the Spectrum Acquisition Block]

Figure 5:
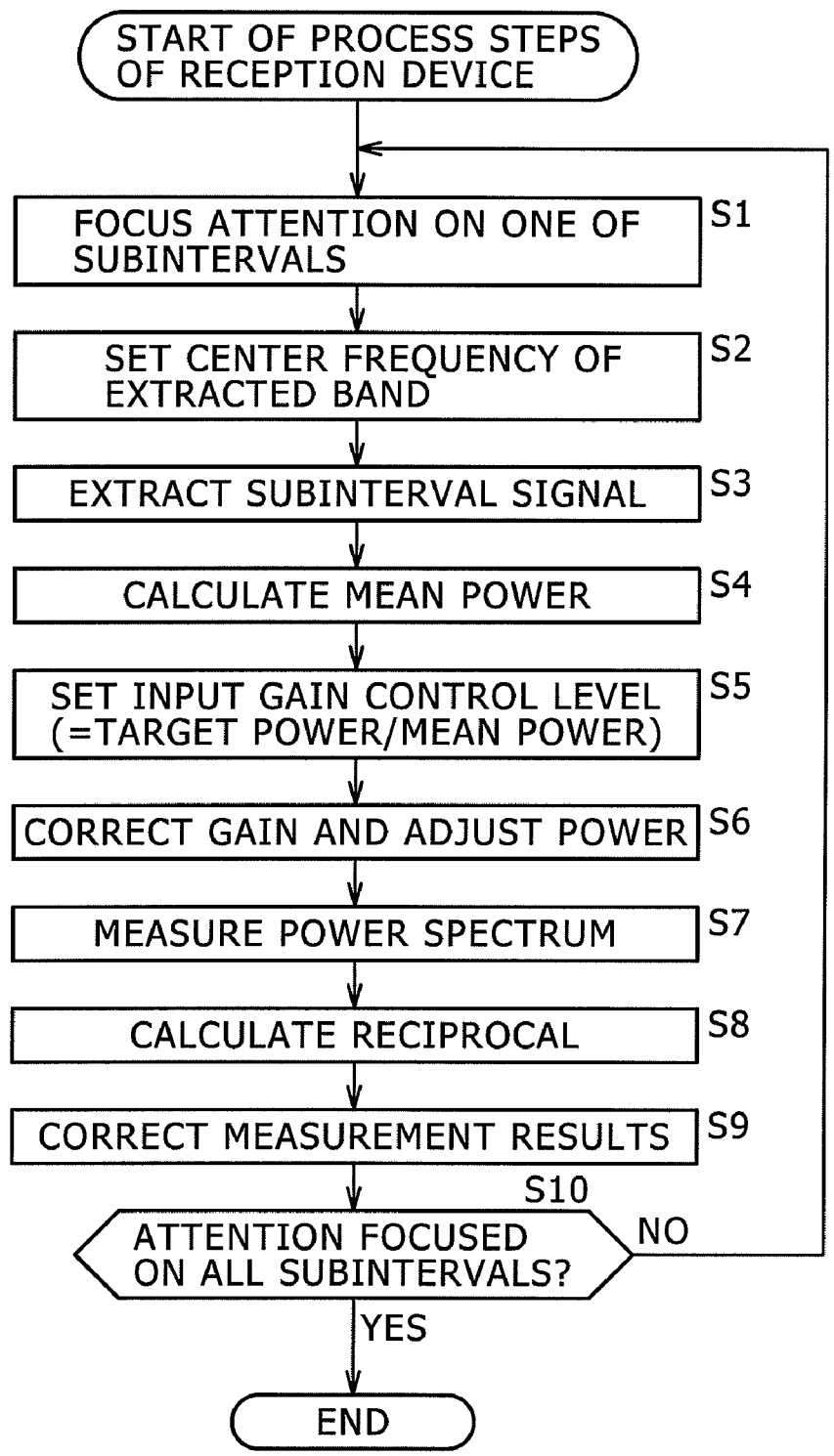
FIG. 5 is a flowchart describing the processes performed by the reception device.

Here, a description will be given of the processes performed by the reception device having the spectrum acquisition block shown in FIG. 3 with reference to the flowchart shown in FIG. 5.

In step S1, the control section 51 divides the entire frequency band, over which the power spectrum is to be measured, into a plurality of subintervals. Attention is focused on one of the subintervals.

In step S2, the control section 51 sets the center frequency of the subinterval of interest in the band extraction filter 22 as the center frequency of the extracted band.

In step S3, the band extraction filter 22 extracts a signal from the input signal supplied from the variable input gain amplification section 21. The extracted signal has a frequency component of a given bandwidth with the center frequency of the extracted band set at the center of the band. The band extraction filter 22 outputs the extracted signal as a subinterval signal. For example, before the input gain control level is found, the variable input gain amplification section 21 adjusts the power of the input signal with a given gain and supplies the adjusted input signal to the band extraction filter 22.

In step S4, the mean power calculation portion 41 calculates the mean power of the subinterval signal.

In step S5, the division portion 42 finds the input gain control level by dividing the target power by the mean power of the subinterval signal.

In step S6, the variable input gain amplification section 21 corrects the current gain by multiplying this gain by the value found as the input gain control level. The same section 21 adjusts the power of the subinterval signal of interest by multiplying the power level by the corrected gain. After the power adjustment by the variable input gain amplification section 21, the subinterval signal of interest is now ready to pass through the band extraction filter 22. As a result, the subinterval signal of interest is supplied to the spectrum measurement section 23 via the band extraction filter 22.

In step S7, the spectrum measurement section 23 measures the power spectrum of the subinterval signal.

In step S8, the reciprocal calculation section 25 calculates the reciprocal of the value calculated by the division portion 42 as the input gain control level.

In step S9, the correction section 26 corrects the measurement results of the spectrum measurement section 23 by multiplying the signal power level by the value calculated by the reciprocal calculation section 25.

In step S10, the control section 51 determines whether attention has been focused on all the subintervals. If not, control returns to step S1 to repeat the same process steps. That is, attention is transferred to a next subinterval, and the process steps are repeated for that subinterval.

The process steps are terminated when it is determined in step S10 that attention has been focused on all the subintervals. When the above steps are performed for all the subintervals, the power spectrum over the entire target frequency range is obtained.

[Channel Extraction]

Figure 6:
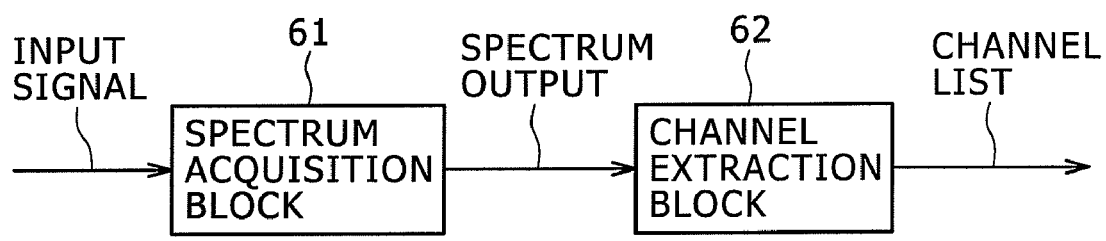
FIG. 6 is a diagram illustrating the spectrum acquisition block and a channel extraction section.

FIG. 6 is a diagram illustrating a spectrum acquisition block 61 configured as shown in FIG. 3 and a channel extraction block 62 serving as a processing block provided at the subsequent stage of the spectrum acquisition block 61.

The channel extraction block 62 is supplied with the power spectrum measured as described above.

The channel extraction block 62 extracts the channels used for television broadcasting based on the power spectrum supplied from the spectrum acquisition block 61.

FIG. 7 is a diagram illustrating an example of channel extraction by the channel extraction block 62.

The waveform shown by a solid line in FIG. 7 represents the power spectrum measured by the spectrum acquisition block 61, and that shown by a dashed line the moving mean of the power spectrum. The black dots represent the intersections between the two waveforms.

In this case, the channel extraction block 62 determines, as the frequency bandwidths of the channel candidate, those bandwidths corresponding to the distances between the black dots for the intervals over which the power spectrum is located above the moving mean. Further, the same section 62 determines, as the center frequencies of the channel candidates, those frequencies at the center between the black dots.

The channel extraction block 62 outputs a channel list to the processing block at the subsequent stage. The channel list describes the information about the frequency bandwidths and center frequencies of the respective channel candidates. The processing block at the subsequent stage sets the channel reception based on the frequency bandwidths and center frequencies determined by the channel extraction block 62.

Thanks to a wider dynamic power range that can be measured as a power spectrum, the power spectrum can be measured properly, thus ensuring high accuracy in channel extraction.

[Modification Example]

FIG. 8 is a block diagram illustrating a configuration example of a first embodiment of a reception system to which a frequency/phase synchronization circuit of the present invention is applied.

The reception system shown in FIG. 8 includes an acquisition block 101, transmission path decoding block 102 and information source decoding block 103.

The acquisition block 101 acquires a signal via an unshown transmission path such as terrestrial digital broadcasting, satellite digital broadcasting, CATV network or the Internet. The same block 101 supplies the signal to the transmission path decoding block 102.

The transmission path decoding block 102 performs transmission path decoding of the signal acquired by the acquisition block 101 via a transmission path. The transmission path decoding includes error correction. The same block 102 supplies the resultant signal to the information source decoding block 103. The transmission path decoding block 102 includes the spectrum acquisition block shown in FIG. 3. The spectrum acquisition block acquires the spectrum as described above.

The information source decoding block 103 performs source decoding of the transmission path-decoded signal. The source decoding includes acquiring data to be transmitted by decompressing the compressed information to its original form.

That is, the signal acquired by the acquisition block 101 via a transmission path may be compressed by compression coding to reduce the amount of video and audio data. In such a case, the information source decoding block 103 performs source decoding of the transmission path-decoded signal including decompression of the compressed information to its original form.

It should be noted that if the signal acquired by the acquisition block 101 via a transmission path is not compression-coded, the information source decoding block 103 does not perform decompression of the compressed information to its original form. Here, the decompression includes, for example, MPEG decoding. On the other hand, the source decoding may include, for example, descrambling in addition to decompression.

The reception system shown in FIG. 8 is applicable, for example, to a television tuner adapted to receive digital television broadcasting. It should be noted that each of the acquisition block 101, transmission path decoding block 102 and information source decoding block 103 may be configured as an independent device (hardware (IC (Integrated Circuit) or software module).

Alternatively, the acquisition block 101, transmission path decoding block 102 and information source decoding block 103 may be combined as an independent device. Still alternatively, the acquisition block 101 and transmission path decoding block 102 may be combined as an independent device. Still alternatively, the transmission path decoding block 102 and information source decoding block 103 may be combined as an independent device.

FIG. 9 is a block diagram illustrating a configuration example of a second embodiment of the reception system to which the frequency/phase synchronization circuit of the present invention is applied.

In FIG. 9, like components as those shown in FIG. 8 are denoted by the same reference numerals, and the description thereof will be omitted as appropriate.

The reception system shown in FIG. 9 is similar to that shown in FIG. 8 in that it includes the acquisition block 101, transmission path decoding block 102 and information source decoding block 103, but differs therefrom in that it additionally includes an output block 111.

The output block 111 is, for example, a display device adapted to display an image or a speaker adapted to produce a sound. The same block 111 produces a video or audio output from the information source decoding block 103 as its output signal. That is, the same block 111 displays an image or produces a sound.

The reception system shown in FIG. 9 is applicable, for example, to a television receiver adapted to receive digital television broadcasting or radio receiver adapted to receive radio broadcasting.

It should be noted that if the signal acquired by the acquisition block 101 is not compression-coded, the signal from the transmission path decoding block 102 is supplied directly to the output block 111.

FIG. 10 is a block diagram illustrating a configuration example of a third embodiment of the reception system to which the frequency/phase synchronization circuit of the present invention is applied.

In FIG. 10, like components as those shown in FIG. 8 are denoted by the same reference numerals, and the description thereof will be omitted as appropriate.

The reception system shown in FIG. 10 is similar to that shown in FIG. 8 in that it includes the acquisition block 101 and transmission path decoding block 102, but differs therefrom in that it does not include the information source decoding block 103 but additionally includes a recording block 121.

The recording block 121 records (stores) the signal from the transmission path decoding block 102 (e.g., MPEG TS packets) to (in) a recording (storage) medium such as optical disk, harddisk (magnetic disk) or flash memory.

The reception system shown in FIG. 10 configured as described above is applicable, for example, to a recorder adapted to record television broadcasting.

It should be noted that the information source decoding block 103 may be provided so that the signal source-decoded by the same block 103, i.e., the image or sound obtained by decoding, can be recorded to the recording block 121.

The above series of processes may be performed by hardware or software. If the series of processes is performed by software, the program making up the software is installed to a computer incorporated in dedicated hardware or a general-purpose personal computer from a program recording medium.

FIG. 11 is a block diagram illustrating a configuration example of computer hardware adapted to perform the above series of processes by executing the program.

A CPU (Central Processing Unit) 151, ROM (Read Only Memory) 152 and RAM (Random Access Memory) 153 are connected together by a bus 154.

An I/O interface 155 is also connected to the bus 154. An input block 156 and output block 157 are connected to the I/O interface 155. The input block 156 includes, for example, a keyboard and mouse. The output block 157 includes, for example, a display and speaker. Further, a storage block 158, communication block 159 and drive 160 are connected to the I/O interface 155. The storage section includes, for example, a harddisk or non-volatile memory. The communication block 159 includes, for example, a network interface. The drive 160 drives a removable medium 161.

In the computer configured as described above, the CPU 151 loads the program from the storage block 158 into the RAM 153 via the I/O interface 155 and bus 154 for execution, thus allowing the above series of processes to be performed.

The program executed by the CPU 151 is supplied, for example, stored in the removable medium 161. Alternatively, the program is supplied via a wired or wireless transmission medium such as a local area network, the Internet or digital broadcasting. The supplied program is installed to the storage block 158.

It should be noted that the program executed by the computer may be designed to perform the processes chronologically according to the sequence described in the present specification. Alternatively, the program may be designed to perform the processes when necessary as when the program is invoked.

The embodiments of the present invention are not limited to those described above, but may be modified without departing from the spirit and scope of the present invention.

The present application contains subject matter related to that disclosed in Japanese Priority Patent Application JP 2009-131259 filed in the Japan Patent Office on May 29, 2009, the entire content of which is hereby incorporated by reference.

What is claimed is:

1. A signal processing device comprising:
adjustment means for adjusting the power of each of subinterval signals by multiplying the subinterval signals by a gain adapted to bring the power to a given level, the subinterval signals being input signals each having a frequency component of one of a plurality of subintervals into which the frequency band over which the power spectrum is to be measured is divided; and correction means for correcting the power of each of the subinterval signals, whose power has been adjusted by the adjustment means, by multiplying the power spectrum by the reciprocal of the gain used for adjustment of the power by the adjustment means.

2. The signal processing device of claim 1 further comprising:
measurement means for measuring the power spectrum of each of the subinterval signals whose power has been adjusted by the adjustment means.

3. The signal processing device of claim 2 further comprising:
setting means for setting the value, obtained by dividing a target power by the mean power of the subinterval signals, in the adjustment means as the gain.

4. The signal processing device of claim 3, wherein the target power is equal to the mean of the upper and lower limits of the power that can be measured by the measurement means as a power spectrum.

5. A signal processing method comprising the steps of:
adjusting the power of each of subinterval signals by multiplying the subinterval signals by a gain adapted to bring the power to a given level, the subinterval signals being input signals each having a frequency component of one of a plurality of subintervals into which the frequency band over which the power spectrum is to be measured is divided; and
correcting the power of each of the subinterval signals, whose power has been adjusted, by multiplying the power spectrum by the reciprocal of the gain used for adjustment of the power.

6. A signal processing device comprising:
an adjustment section configured to adjust the power of each of subinterval signals by multiplying the subinterval signals by a gain adapted to bring the power to a given level, the subinterval signals being input signals each having a frequency component of one of a plurality of subintervals into which the frequency band over which the power spectrum is to be measured is divided; and
a correction section configured to correct the power of each of the subinterval signals, whose power has been adjusted by the adjustment section, by multiplying the power spectrum by the reciprocal of the gain used for adjustment of the power by the adjustment section.

* * * * *